(12) United States Patent
Jost et al.

(10) Patent No.: US 6,418,008 B1
(45) Date of Patent: Jul. 9, 2002

(54) ENHANCED CAPACITOR SHAPE

(75) Inventors: Mark Jost; William Stanton; Christophe Pierrat, all of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/798,992

(22) Filed: Mar. 6, 2001

Related U.S. Application Data

(62) Division of application No. 09/028,050, filed on Feb. 23, 1998.

(51) Int. Cl.[7] ............................................... H01G 4/005
(52) U.S. Cl. ......................................... 361/303; 257/296
(58) Field of Search ............................... 361/301.4, 303, 361/306.1, 311–313, 329; 257/396, 296, 52, 301, 309

(56) References Cited

U.S. PATENT DOCUMENTS

| | | |
|---|---|---|
| 5,049,520 A | 9/1991 | Cathey |
| 5,120,674 A | 6/1992 | Chin et al. |
| 5,162,248 A | 11/1992 | Dennison et al. |
| 5,168,073 A | 12/1992 | Gonzalez et al. |
| 5,278,091 A | 1/1994 | Fazan et al. |
| 5,292,677 A | 3/1994 | Dennison |
| 5,340,763 A | 8/1994 | Dennison |
| 5,340,765 A | 8/1994 | Dennison et al. |
| 5,391,511 A | 2/1995 | Doan et al. |
| 5,401,681 A | 3/1995 | Dennison |
| 5,453,633 A | 9/1995 | Yun |
| 5,494,841 A | 2/1996 | Dennison et al. |
| 5,498,562 A | 3/1996 | Dennison et al. |
| 5,563,089 A | 10/1996 | Jost et al. |
| 5,652,164 A | 7/1997 | Dennison et al. |
| 5,663,585 A | 9/1997 | Lee et al. |
| 5,691,551 A | 11/1997 | Eimori |
| 5,891,807 A | 4/1999 | Muller et al. |
| 6,018,174 A | 1/2000 | Schrems et al. |
| 6,042,998 A | 3/2000 | Brueck et al. |

Primary Examiner—Anthony Dinkins
(74) Attorney, Agent, or Firm—Dickstein Shapiro Morin & Oshinsky LLP

(57) ABSTRACT

A capacitor having a pear-shaped cross section is provided. In one embodiment, the pear-shaped capacitor is a stacked container capacitor used in a dynamic random access memory circuit with a bit-line-over-capacitor construction. Each capacitor is at a minimum bit line distance from all adjacent bit line contacts, and also at a minimum capacitor distance from all adjacent capacitors along a substantial portion of its perimeter.

5 Claims, 17 Drawing Sheets

ENHANCED CAPACITOR SHAPE

This application is a divisional of application Ser. No. 09/028,050, filed on (Feb. 23, 1998, the entire content to which is incorporated bed reference.

FIELD OF THE INVENTION

The invention relates generally to integrated circuits and more particularly to the shape of a container capacitor for use in an integrated circuit.

BACKGROUND OF THE INVENTION

Capacitors are used in a wide variety of semiconductor circuits. Capacitors are of special concern in DRAM (dynamic random access memory) memory circuits; therefore, the invention will be discussed in connection with DRAM memory circuits. However, the invention has broader applicability and is not limited to DRAM memory circuits. It may be used in any other type of memory circuit, such as an SRAM (static random access memory), as well as in any other circuit in which capacitors are used.

DRAM memory circuits are manufactured by replicating millions of identical circuit elements, known as DRAM cells, on a single semiconductor wafer. A DRAM cell is an addressable location that can store one bit (binary digit) of data. In its most common form, a DRAM cell consists of two circuit components: a storage capacitor and an access field effect transistor.

FIG. 1 illustrates a portion of a DRAM memory circuit containing two neighboring DRAM cells 10. For each cell, one side of the storage capacitor 14 is connected to a reference voltage, which is typically one half of the internal operating voltage (the voltage corresponding to a logical "1" signal) of the circuit. The other side of the storage capacitor 14 is connected to the drain of the access field effect transistor 12. The gate of the access field effect transistor 12 is connected to a signal referred to as the word line 18. The source of the field effect transistor 12 is connected to a signal referred to as the bit line 16. With the circuit connected in this manner, it is apparent that the word line controls access to the storage capacitor 14 by allowing or preventing the signal (a logic "0" or a logic "1") on the bit line 16 to be written to or read from the storage capacitor 14.

The manufacturing of a DRAM cell therefore includes the fabrication of a transistor, a capacitor, and three contacts: one each to the bit line, the word line, and the reference voltage.

DRAM manufacturing is a highly competitive business. There is continuous pressure to decrease the size of individual cells and increase memory cell density to allow more memory to be squeezed onto a single memory chip. However, it is necessary to maintain a sufficiently high storage capacitance to maintain a charge at the refresh rates currently in use even as cell size continues to shrink. This requirement has led DRAM manufacturers to turn to three dimensional capacitor designs, including trench and stacked capacitors. Stacked capacitors are capacitors which are stacked, or placed, over the access transistor in a semiconductor device. In contrast, trench capacitors are formed in the wafer substrate beneath the transistor. For reasons including ease of fabrication and increased capacitance, most manufacturers of DRAMs larger than 4 Megabits use stacked capacitors. Therefore, the invention will be discussed in connection with stacked capacitors but should not be understood to be limited thereto. For example, use of the invention in trench or planar capacitors is also possible.

One widely used type of stacked capacitor is known as a container capacitor. Known container capacitors are in the shape of an upstanding tube (cylinder) having an oval or circular cross section. The wall of the tube consists of two plates of conductive material such as doped polycrystalline silicon (referred to herein as polysilicon or poly) separated by a dielectric. The bottom end of the tube is closed, with the outer wall in contact with either the drain of the access transistor or a plug which itself is in contact with the drain. The other end of the tube is open (the tube is filled with an insulative material later in the fabrication process). The sidewall and closed end of the tube form a container; hence the name "container capacitor." Although the invention will be further discussed in connection with stacked container capacitors, the invention should not be understood to be limited thereto.

FIG. 2 illustrates a top view of a portion of a known DRAM memory circuit from which the upper layers have been removed to reveal container capacitors 14 arranged around a bit line contact 16. Six container capacitors 14 are shown in FIG. 2, each of which has been labeled with separate reference designations A to F. Recall from FIG. 1 that the bit lines of neighboring DRAM cells are electrically connected. To increase density, bit line contacts are shared by neighboring DRAM cells. In FIG. 2, the bit line contact 16 is shared by DRAM cells corresponding to container capacitors A and B. Not shown in FIG. 2 are additional bit line contacts to the upper left, upper right, lower left and lower right of the illustrated bit line contact 16. Container capacitors C, D, E and F are respectively associated with these additional bit line contacts.

To ensure that the neighboring container capacitors 14 remain isolated, it is necessary to maintain a minimum distance Dc, referred to herein as the minimum capacitor distance, between the outer layers 30 of separate container capacitors 14. The minimum capacitor distance is the minimum distance by which neighboring capacitors must be separated so that effects such as bridging, punch-through and parasitic capacitance are prevented. The distance Dc is typically on the order of one thousand angstroms or less, and can be as small as several hundred angstroms. The actual distance is dependent upon the particular fabrication process and materials. Similarly, it is also necessary to maintain a minimum distance Db, referred to herein as the minimum bit line distance, between the outer layers 30 of each container capacitor 14 and the bit line contact 16. The minimum bit line distance Db is illustrated by a circle 40. The minimum bit line distance Db, which will often be different from the minimum capacitor distance Dc, is dependent upon alignment errors between the masks used to create the capacitor openings and the bit line contact openings as well as the effects mentioned in connection with the minimum capacitor distance Dc.

It is apparent from FIG. 2 that only container capacitors A and B are at the minimum bit line distance Db. The other four container capacitors C, D, E and F are at distances slightly greater than the minimum bit line distance Db. It is also apparent from FIG. 2 that each outer layer 30 of the container capacitors 14 is separated from the outer layer 30 of a neighboring container capacitor 30 at the minimum capacitor distance Dc at only one point on its perimeter—the point at which the transition from a flat top 14a or bottom wall 14b to a semi-circular side wall 14c occurs. The points at the minimum capacitor distance Dc are at the locations indicated by the vertical line segments Dc shown in FIG. 2.

Because only one point on the perimeter of each of the oval-shaped container capacitors 14 is at the minimum capacitor distance Dc from each neighboring container capacitor 14, and only two of the six container capacitors 14 are at the minimum bit line distance Db, it is apparent that valuable memory cell space, between the containers and the bit line contact is wasted. Although not illustrated, container capacitors with circular cross sections suffer from similar inefficiencies. Thus, known container capacitor shapes do not make efficient use of available space.

As memory cell density continues to increase, efficient use of space becomes ever more important. Therefore, what is needed is a container capacitor that makes more efficient use of available memory cell space.

SUMMARY OF THE INVENTION

The present invention provides an improved container capacitor with a pear-shaped cross section, as own, for example, in FIG. 3. The pear-shaped cross section has a larger perimeter, resulting in increased capacitor wall area and therefore increased capacitance, without decreasing the minimum bit line distance Db or minimum capacitor distance Dc. One result of the pear shape of the container capacitors is that neighboring container capacitors are separated by the minimum capacitor distance Dc over a greater portion of their perimeters than is the case with circular or oval container capacitors.

DETAILED DESCRIPTION OF THE PREFERRED EMBODIMENTS

An exemplary construction of a fabrication process for a container capacitor according to one embodiment of the present invention is described below. It is to be understood, however, that this process is only one example of many possible processes. For example, the bit line is formed over the capacitor in the following process. A buried bit-line process could also be used. As another example, the plugs under the capacitors formed by the following process could be eliminated. Also, dry or wet etching could be used rather than chemical mechanical polishing. The invention is not intended to be limited by the particular process described below.

Figure 4:
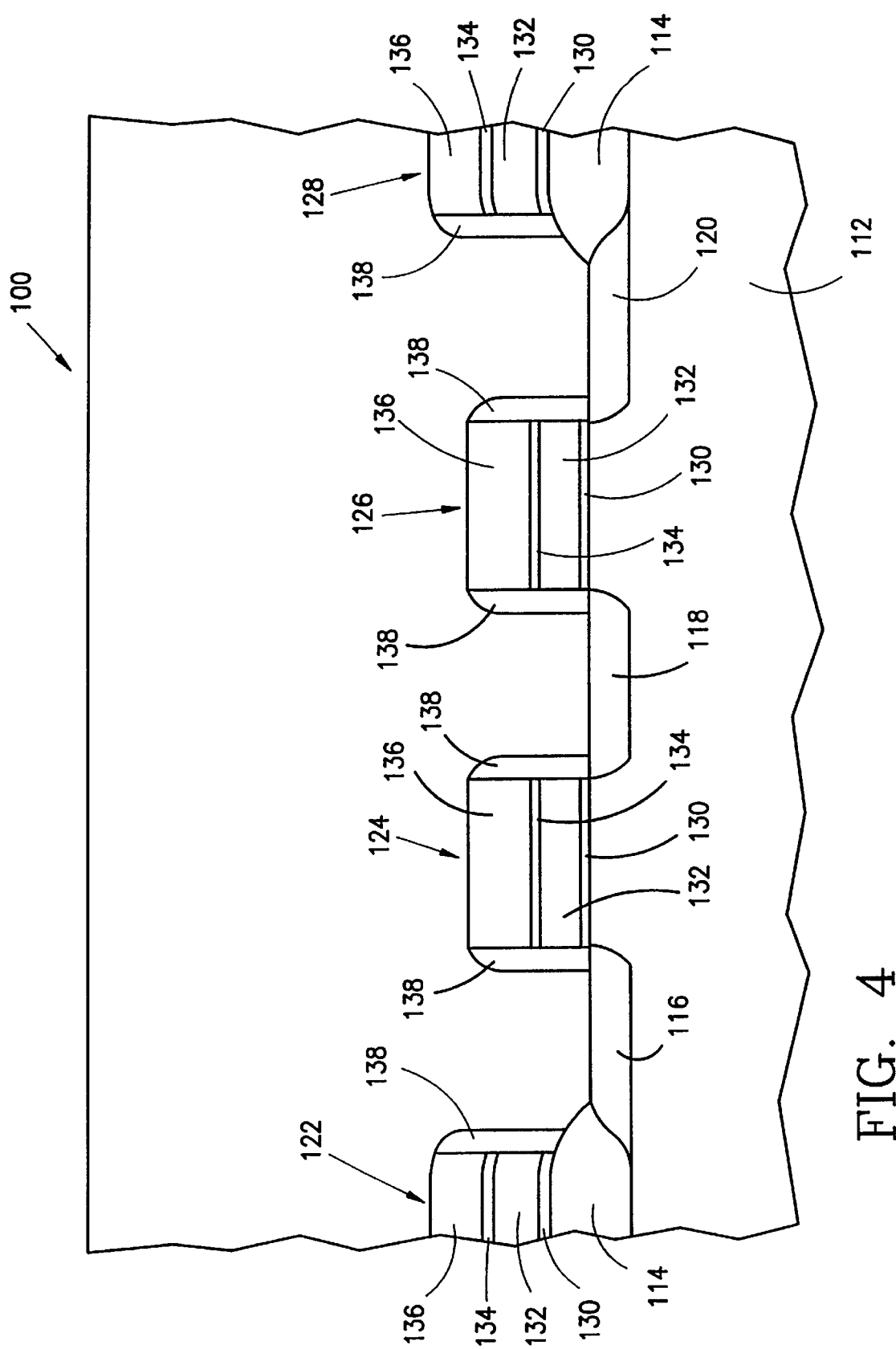
FIG. 4 is a diagrammatic cross-sectional view taken along the line IV—IV of FIG. 3 of a portion of a semiconductor wafer at an early processing step according to one embodiment of the present invention.

Referring now to FIG. 4, a semiconductor wafer fragment at an early processing step is indicated generally by reference numeral 100. The semiconductor wafer 100 is comprised of a bulk silicon substrate 112 with field isolation oxide regions 114 and active areas 116, 118, 120 formed therein. Word lines 122, 124, 126, 128 have been constructed on the wafer 100 in a conventional manner. Each word line consists of a lower gate oxide 130, a lower poly layer 132, a higher conductivity silicide layer 134 and an insulating silicon nitride cap 136. Each word line has also been provided with insulating spacers 138, which are also composed of silicon nitride.

Two FETs are depicted in FIG. 4. One FET is comprised of two active areas (source/drain) 116, 118 and one word line (gate) 124. The second FET is comprised of two active areas (source/drain) 118, 120 and a second word line (gate) 126. The active area 118 common to both FETs is the active area over which a bit line contact will be formed. As discussed above, one bit line contact is shared by two DRAM cells to conserve space.

Figure 5:
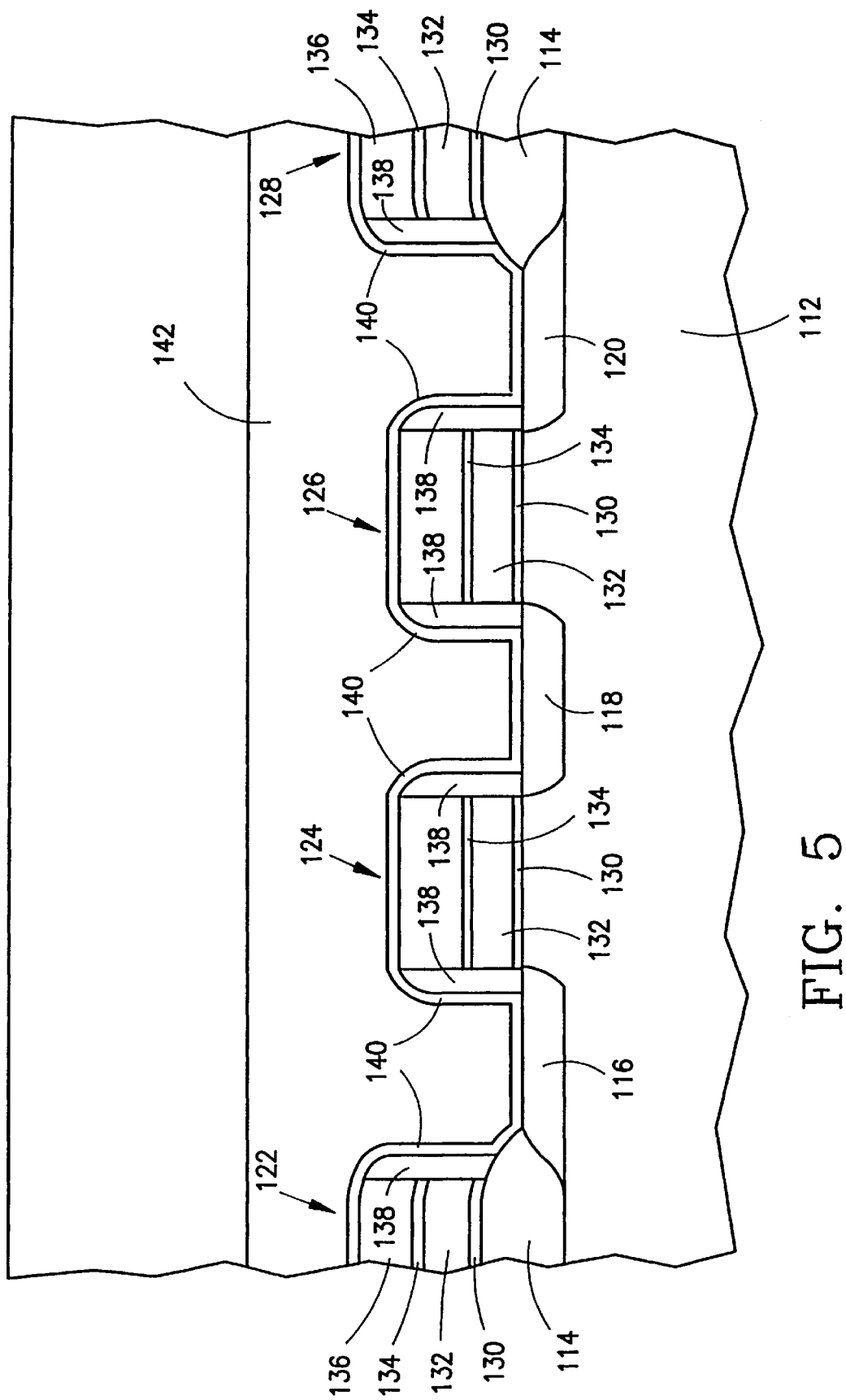
FIG. 5 is a diagrammatic cross-sectional view of a portion of a semiconductor wafer at a processing step subsequent to that shown in FIG. 4.

Referring now to FIG. 5, a thin layer 140 of nitride or TEOS (tetraethyl orthosilicate) is then provided atop the wafer 100. Next a layer of insulating material 142 is deposited. The insulating material consists of borophosphosilicate glass (BPSG). The insulating layer 142 is subsequently planarized by chemical-mechanical polishing (UMP).

Figure 6:
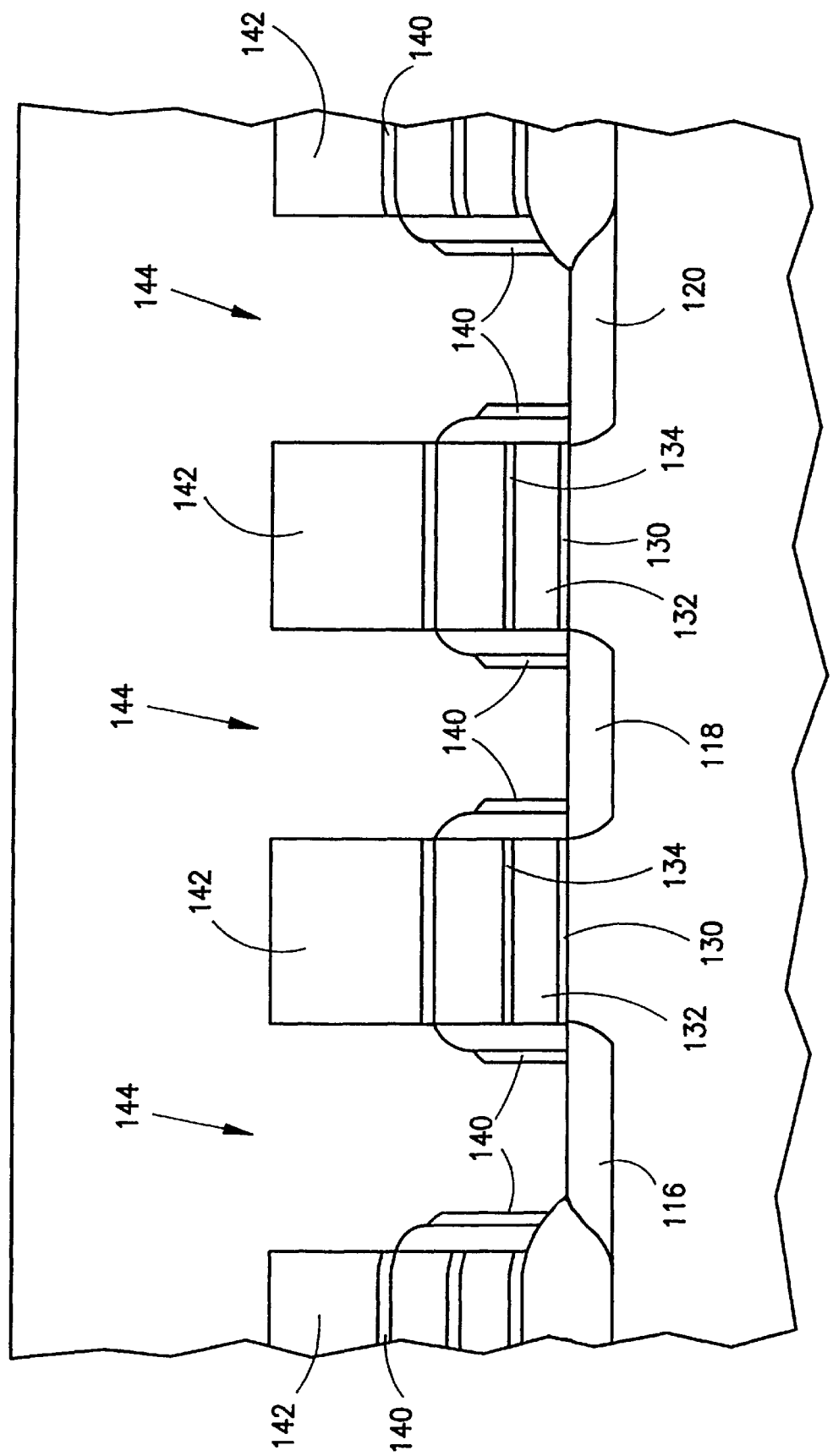
FIG. 6 is a diagrammatic cross-sectional view of a portion of a semiconductor wafer at a processing step subsequent to that shown in FIG. 5.
Figure 7:
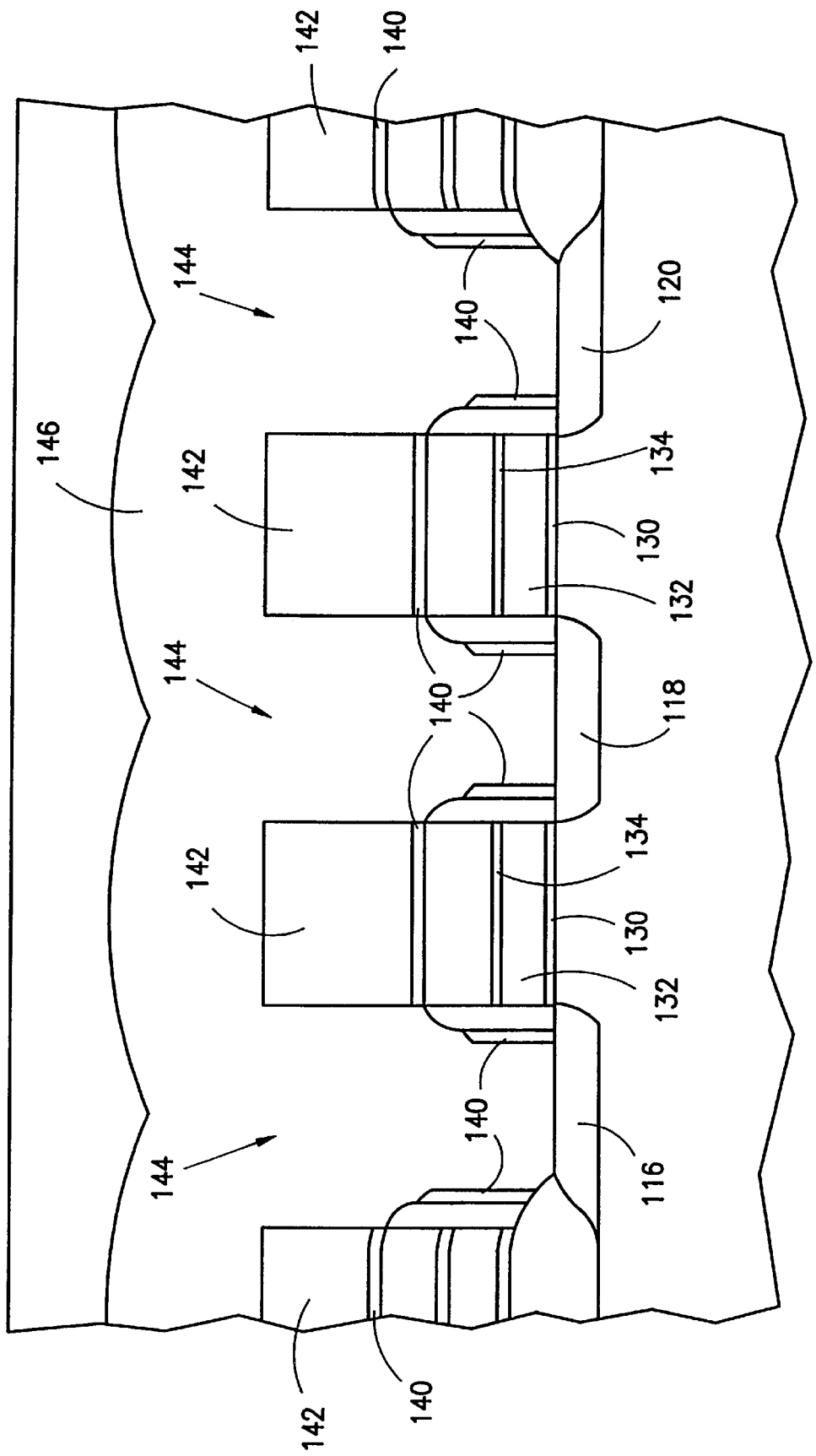
FIG. 7 is a diagrammatic cross-sectional view of a portion of a semiconductor wafer at a processing step subsequent to that shown in FIG. 6.
Figure 8:
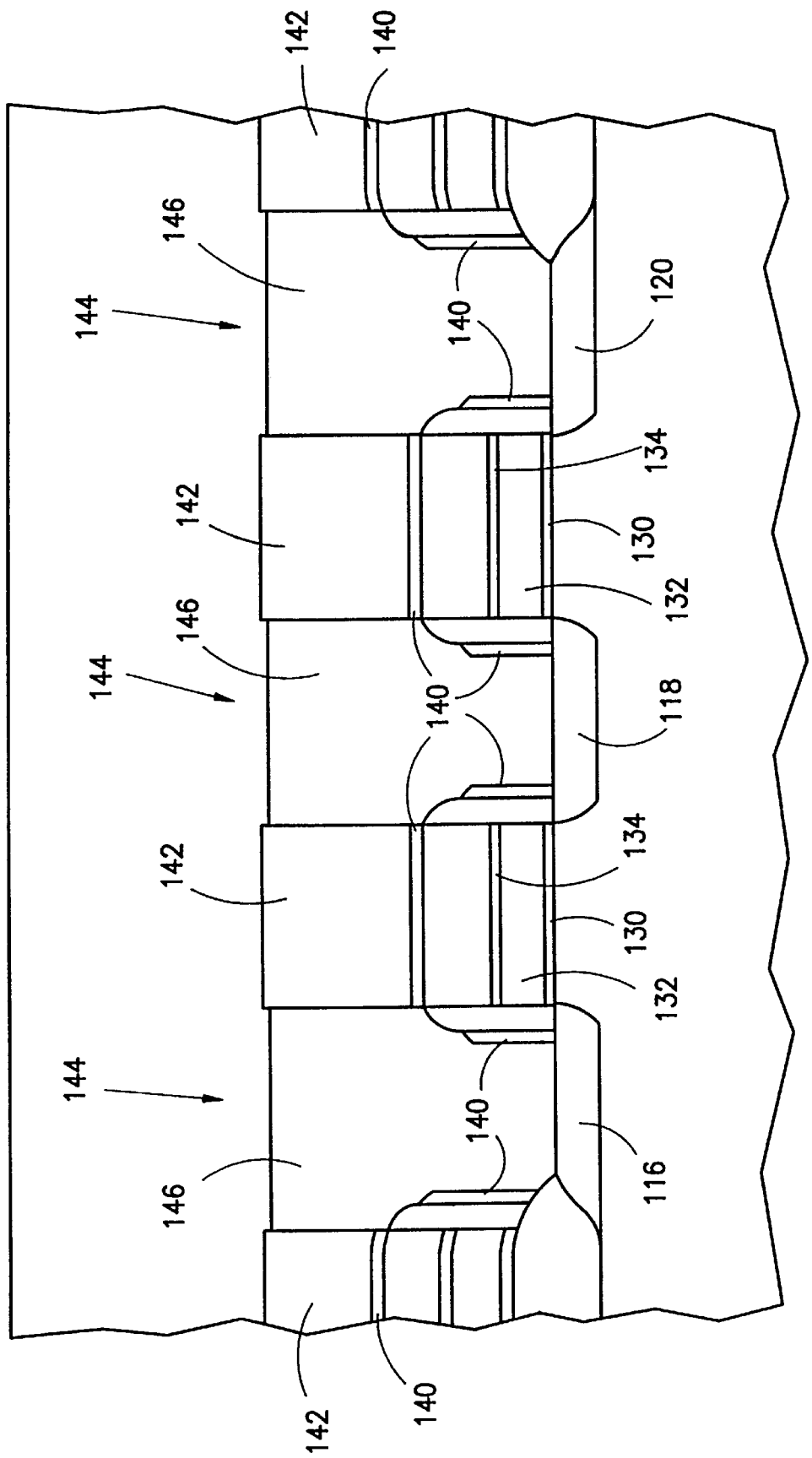
FIG. 8 is a diagrammatic cross-sectional view of a portion of a semiconductor wafer at a processing step subsequent to that shown in FIG. 7.

Referring now to FIG. 6, plug openings have been formed through the insulating layer 142. The plug openings 144 are formed through the insulating layer 142 by photomasking and dry chemical etching the BPSG relative to the thin nitride layer 140. Referring now to FIG. 7, a layer 146 of conductive material is deposited to provide conductive material within the plug openings 144. The conductive layer 146 is in contact with the active areas 116, 118, 120. An example of the material used to form layer 146 is in situ arsenic or phosphorous doped poly. Referring now to FIG. 8, the conductive layer 146 is dry etched (or chemical-mechanical polished) to a point just below the upper surface of the BPSG layer 142 such that the remaining material of the conductive layer 146 forms electrically isolated plugs 146 over the active areas 116, 118, 120.

Figure 9:
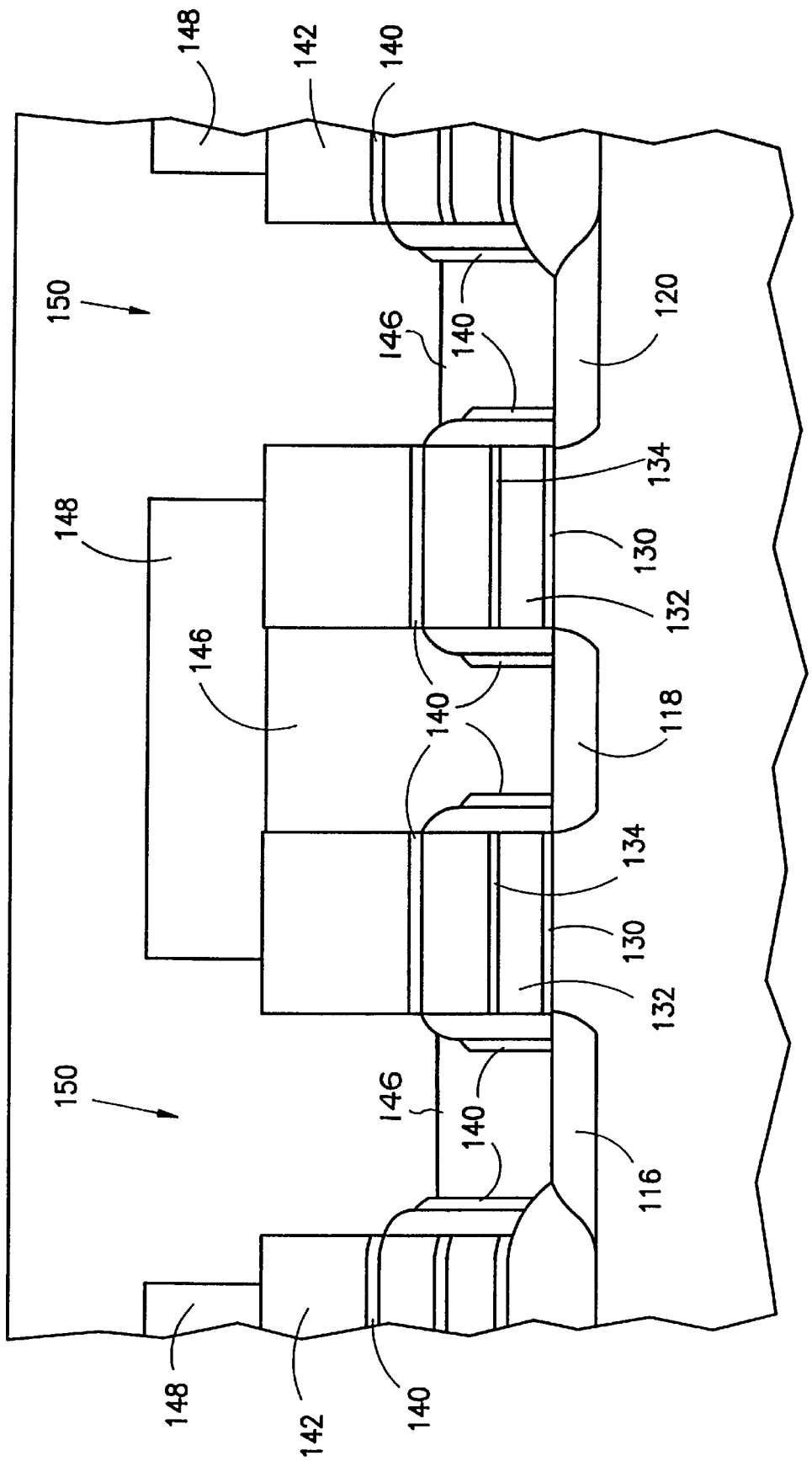
FIG. 9 is a diagrammatic cross-sectional view of a portion of a semiconductor wafer at a processing step subsequent to that shown in FIG. 8.

A additional layer 148 of BPSG is then deposited on the structure of FIG. 8. Referring now to FIG. 9, capacitor openings 150 are then formed in the BPSG layer 148 by photomasking and dry chemical etching. The height of the plugs 146 over the non-bit line active areas 116, 120 is also reduced by this step. The shape of the mask used to form the capacitor openings 150 will be discussed further below in connection with FIG. 15.

Figure 10:
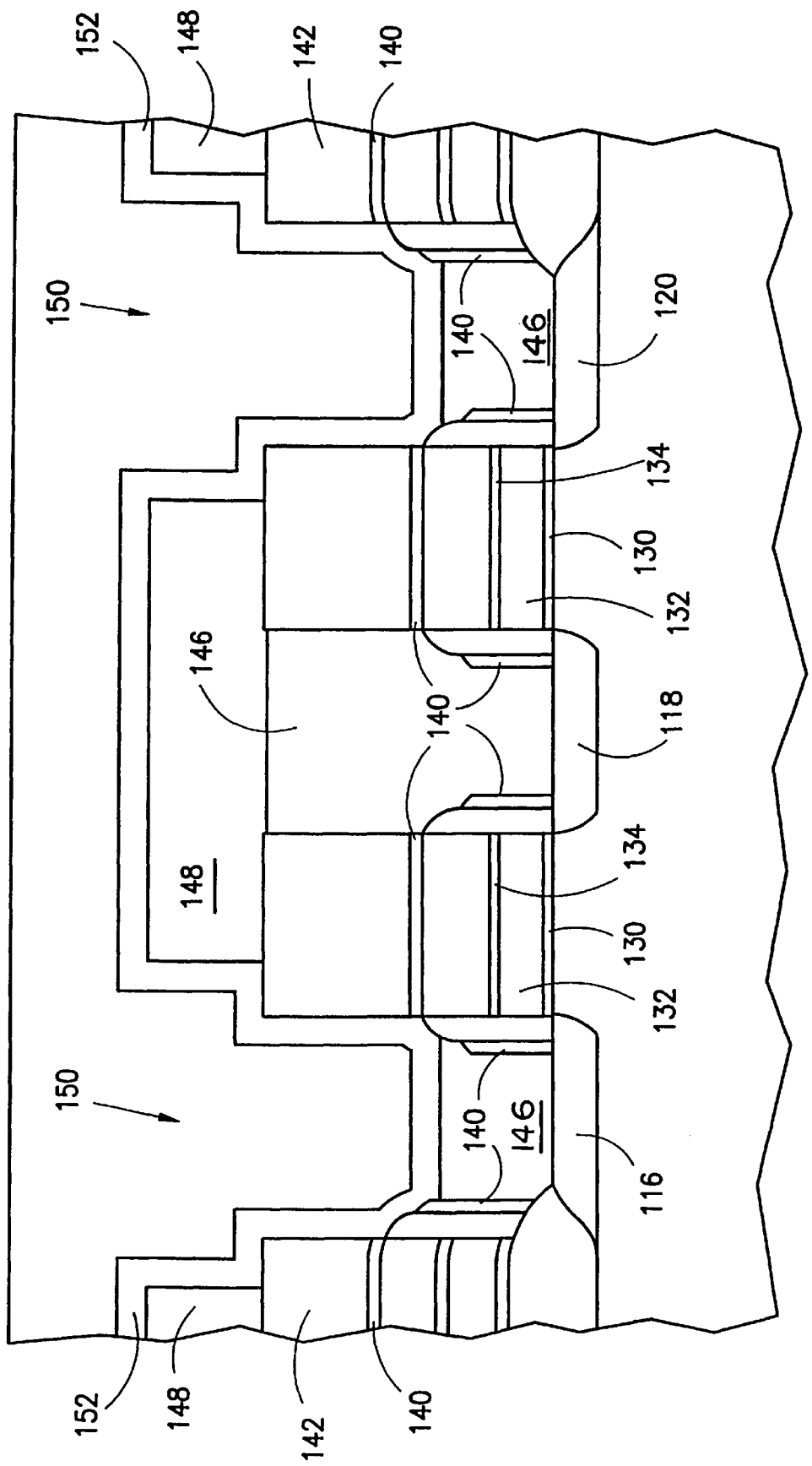
FIG. 10 is a diagrammatic cross-sectional view of a portion of a semiconductor wafer at a processing step subsequent to that shown in FIG. 9.

Referring now to FIG. 10, a layer 152 of conductive material that will eventually form one of the plates of the capacitor is deposited at a thickness such that the capacitor openings 150 are not closed off. The layer 152 may be formed of hemispherical grained poly (HSG) to increase capacitance. If HSG poly is used, the layer 152 may be formed by first depositing a layer of in situ doped polysilicon followed by a deposition of undoped HSG. Subsequent heating inherent in wafer processing will effectively conductively dope the overlying HSG layer. Alternatively, the conductive layer 152 may be provided by in situ arsenic doping of an entire HSG layer. The conductive layer 152 is in electrical contact with the previously formed plugs 146 over the non-bit line active areas 116, 120.

Figure 1:
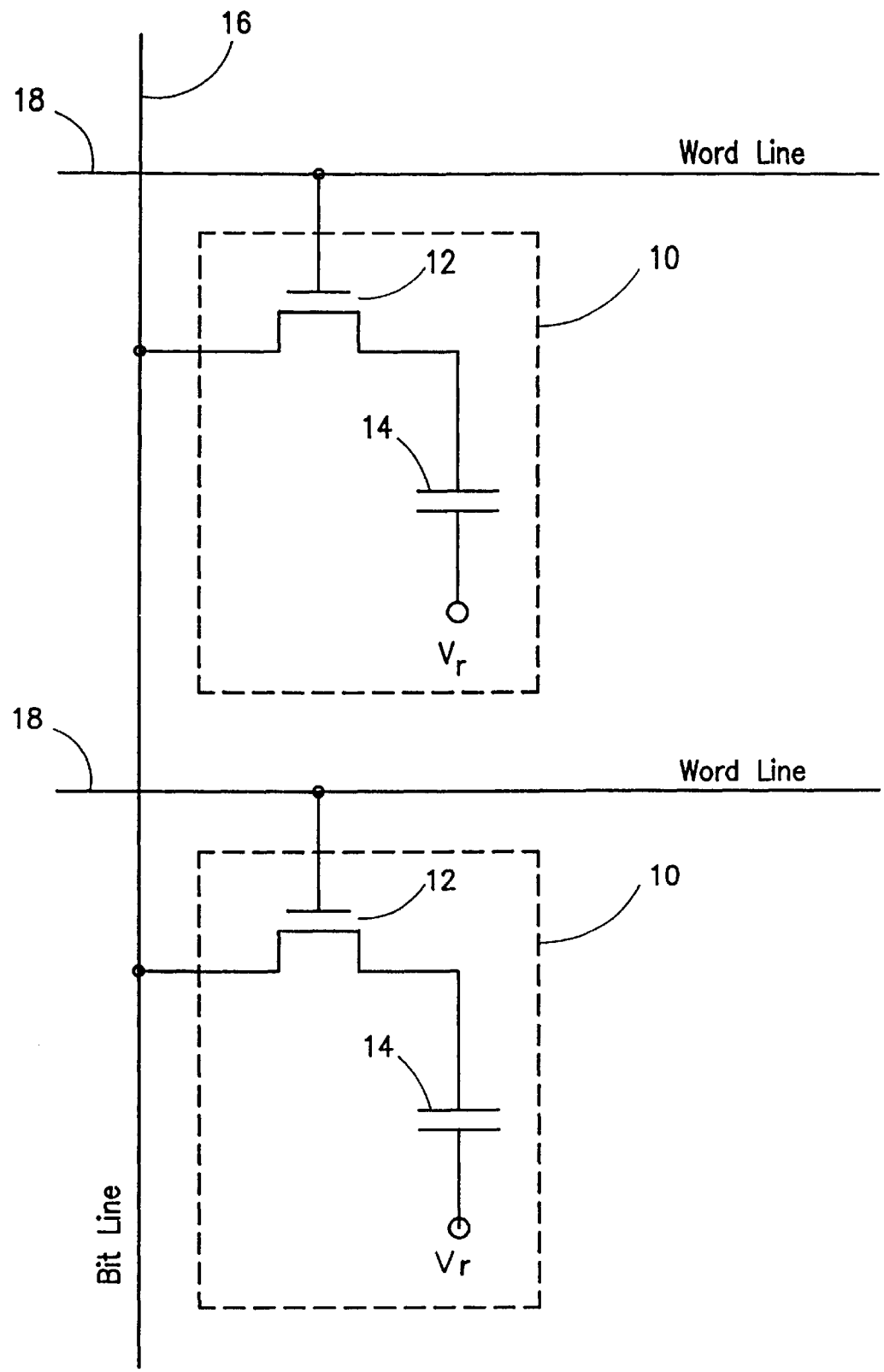
FIG. 1 is a circuit diagram of a portion of a conventional DRAM memory circuit.
Figure 11:
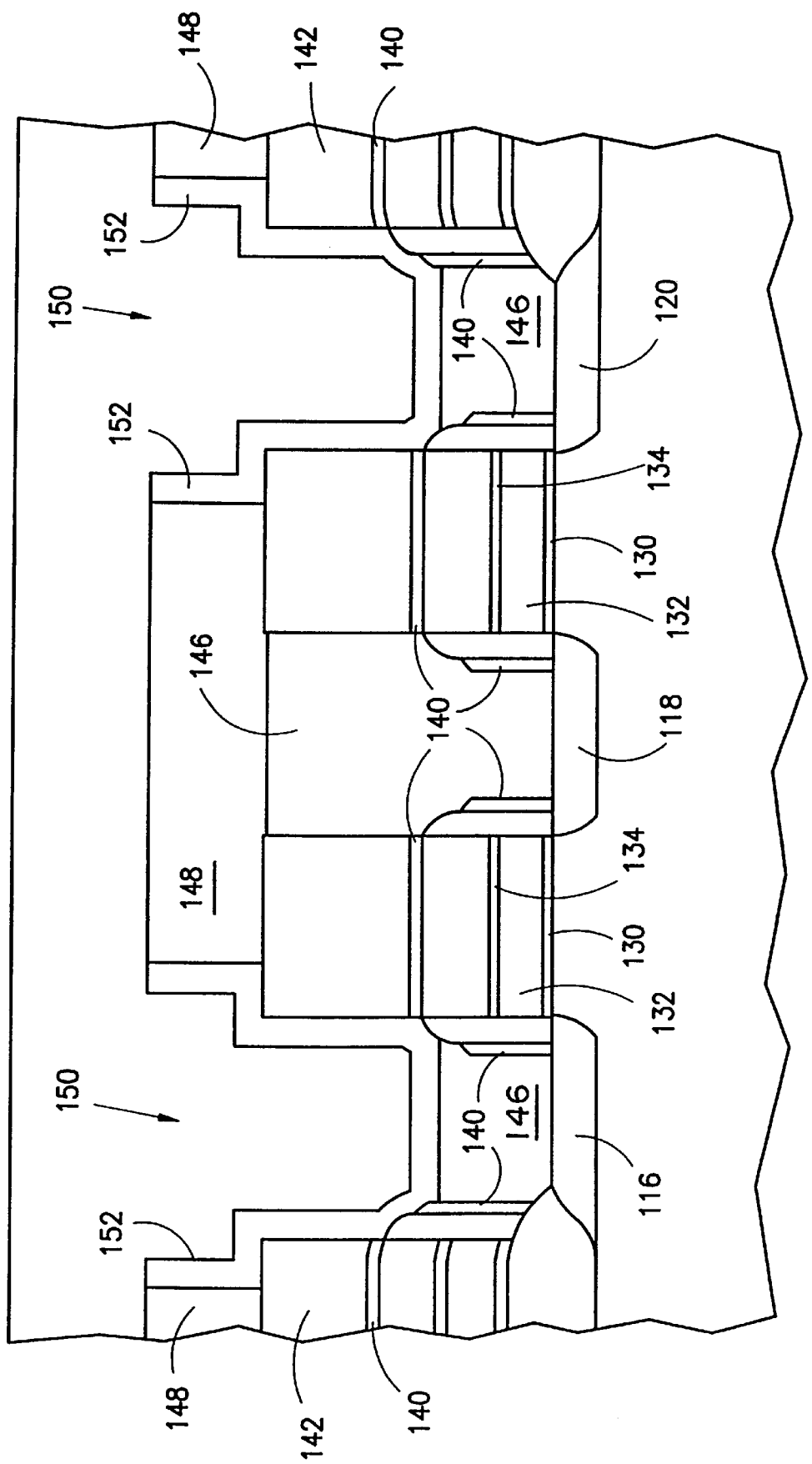
FIG. 11 is a diagrammatic cross-sectional view of a portion of a semiconductor wafer at a processing step subsequent to that shown in FIG. 10.
Figure 12:
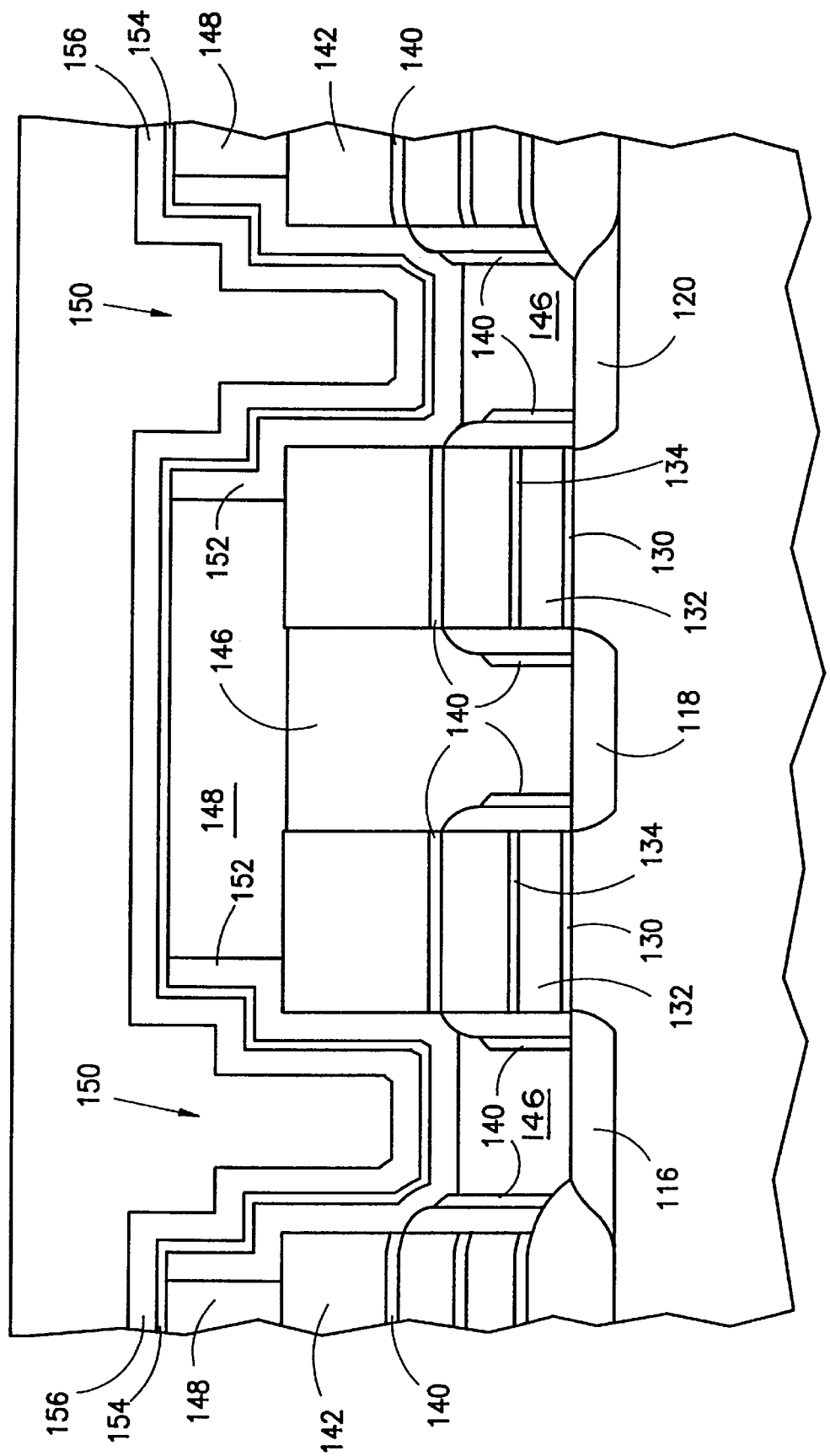
FIG. 12 is a diagrammatic cross-sectional view of a portion of a semiconductor wafer at a processing step subsequent to that shown in FIG. 11.

Referring now to FIG. 11, the portion of the conductive layer 152 above the top of the second BPSG layer 148 is removed through a CMP or planarized etching process, thereby electrically isolating the portions of layer 152 remaining in the capacitor openings 150. Referring now to FIG. 12, a capacitor dielectric layer 154 is provided over the second BPSG layer 148 and over the conductive layer 152 within the capacitor openings 150. The dielectric layer 154 is deposited with a thickness such that the capacitor openings 150 are again not completely filled. The dielectric layer 154 preferably comprises an oxide-nitride-oxide (ONO) dielectric, although other materials are of course possible. A second conductive layer 156 is deposited over the dielectric layer 154, again at a thickness which less than completely fills the bit line contact and capacitor openings 144, 146. The second conductive layer 156 is preferably composed of poly. In addition to serving as the second plate of the capacitor, the second conductive layer 156 also forms the interconnection lines between the second plates of all capacitors. The second plate is the plate of the capacitor that is connected to the reference voltage as discussed in connection with FIG. 1.

Figure 13:
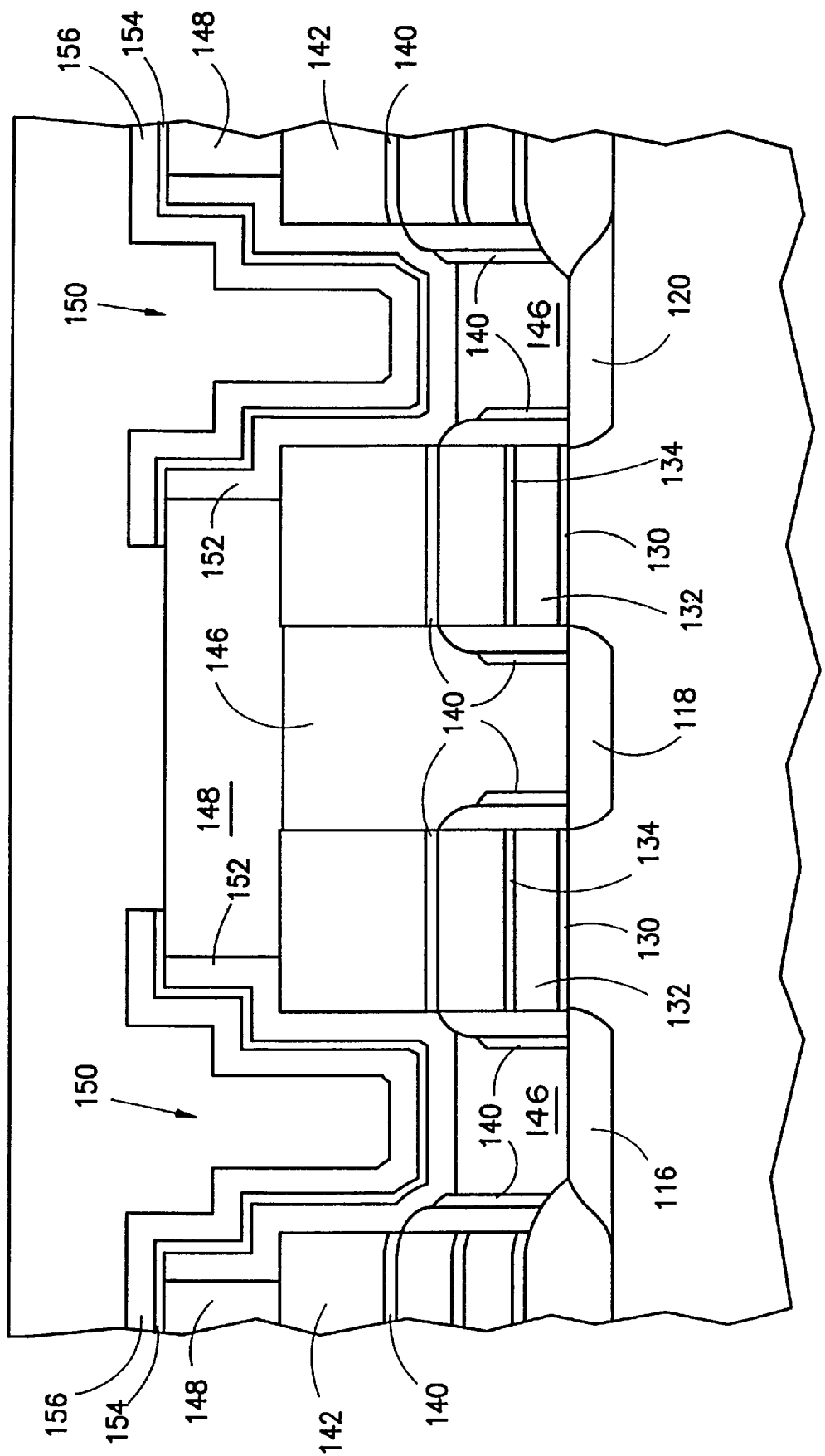
FIG. 13 is a diagrammatic cross-sectional view of a portion of a semiconductor wafer at a processing step subsequent to that shown in FIG. 12.

Referring now to FIG. 13, the second conductive layer 156 and underlying capacitor dielectric layer 154 are patterned and etched such that the remaining portions of each group of the first conductive layer 152, capacitor dielectric layer 154, and second conductive layer 156 over the capacitor openings 150 are electrically isolated from each other. In this manner, each of the active areas 116, 118, 120 are also electrically isolated (without the influence of the gate).

Figure 14:
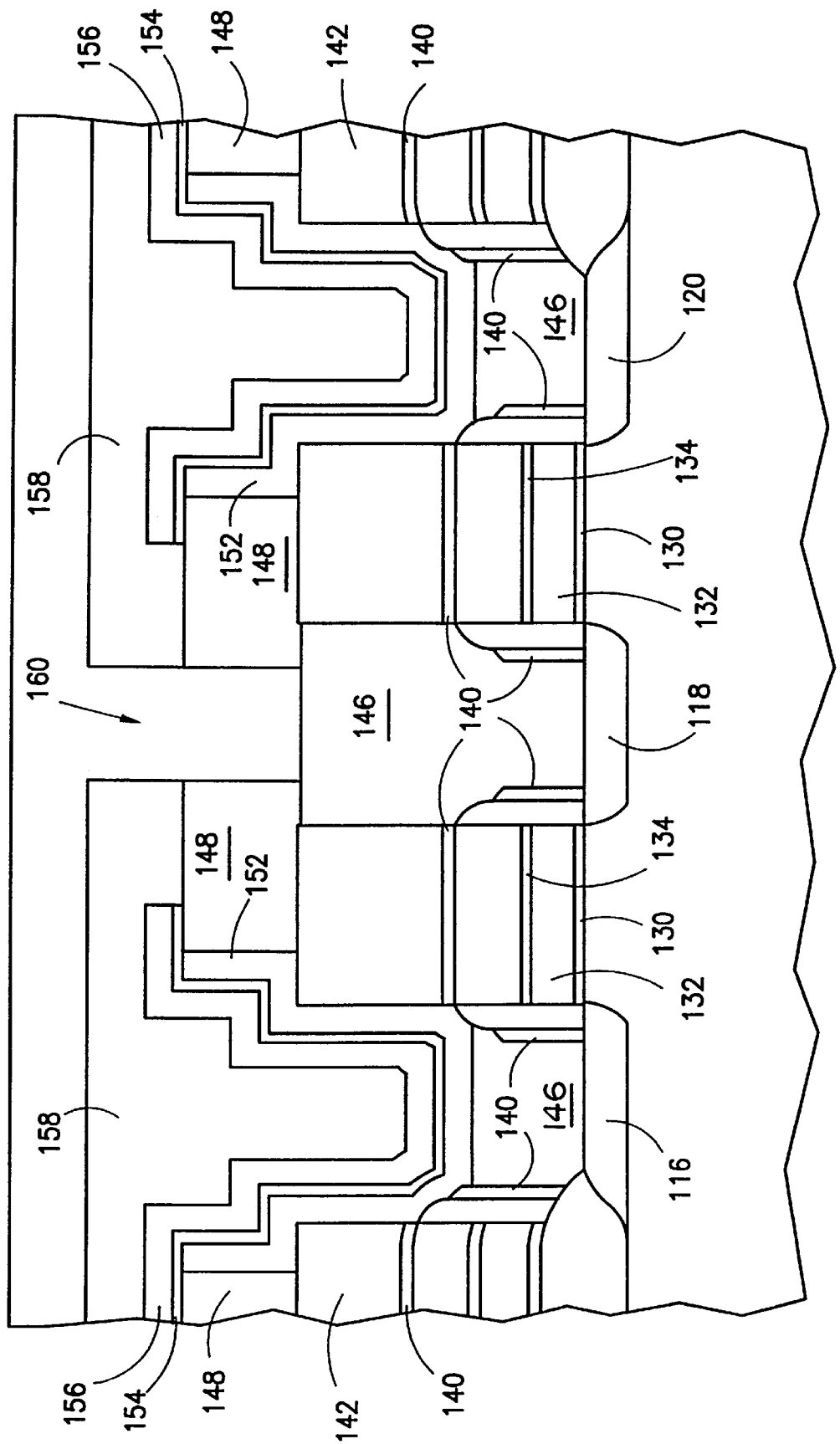
FIG. 14 is a diagrammatic cross-sectional view of a portion of a semiconductor wafer at a processing step subsequent to that shown in FIG. 13.

Referring now to FIG. 14, a bit line insulating layer 158 is provided over the second conductive layer 156 and the second BPSG layer 148. The bit line insulating layer 158 may be comprised of BPSG. A bit line contact opening 160 is patterned through the bit line insulating layer 158 such that the conductive plug 146 is once again outwardly exposed. Then a bit line contact is provided in the bit line contact opening 160 such that the bit line contact is in electrical contact with the outwardly exposed portion of the plug 146. Thus, the outwardly exposed portion of the plug 146 over the active area 118 common to both FETs acts as a bit line contact.

Figure 15:
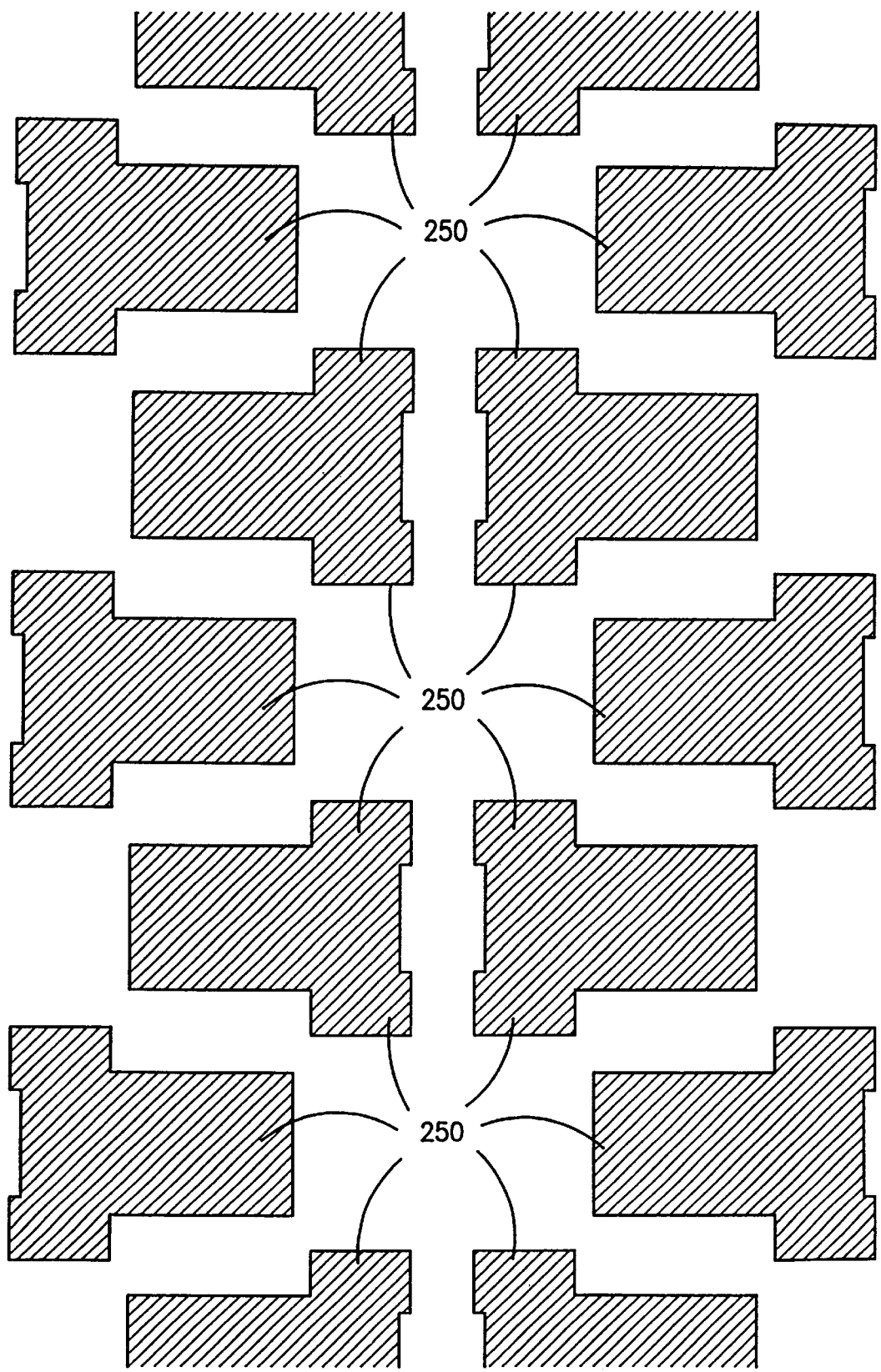
FIG. 15 is a top view of a mask used in a Processing step discussed in connection with FIG. 6.

FIG. 15 shows a mask 200 used for creating the capacitor openings 150 discussed in connection with FIG. 9. The mask 200 contains capacitor openings 250. It is apparent that the capacitor openings in the mask of FIG. 14 are shaped differently from the capacitors 14 shown in FIG. 3. This is because the light used in the photomasking process is diffracted by the openings in the mask 200. Thus, the shape of the capacitor openings 246 in the mask 200 results in the shape of the capacitor openings 150 discussed in connection with FIG. 9 and therefore also results in the shape of the capacitors 14 shown in FIG. 3.

Figure 3:
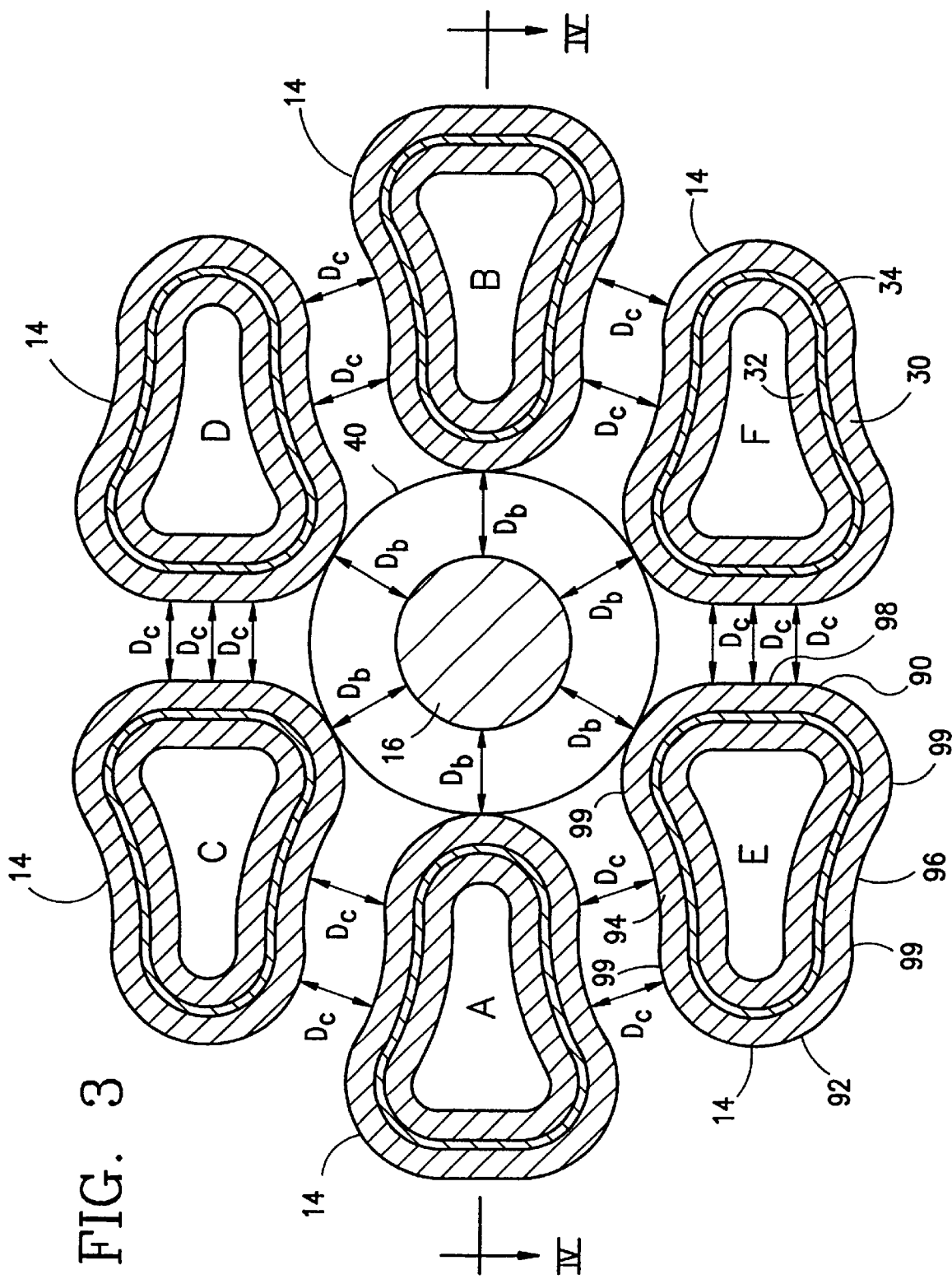
FIG. 3 is a top view of a cross section of one embodiment of a memory circuit according to the present invention showing a number of pear-shaped container capacitors surrounding a bit line contact.

The cross sectional shape of the resultant capacitor 14 shown in FIG. 3 is but one example of a pear shape. A pear shape according to the invention can be characterized as follows. The shape is generally, but not necessarily, symmetrical about only one axis, i.e., the horizontal axis X shown in FIG. 3. One side 90 is generally flat and wide, while the other side 92 is relatively narrow and generally round.

Referring now to capacitor E of FIG. 3, the pear shape according to the present invention can also be characterized as having a convex side 92, an opposing side 90 which includes a flat portion 98 and two convex lobes 99, and two opposing concave sides 94, 96. The convex lobes 99 are generally smaller and more convex than convex side 92. The opposing concave sides 94, 96 are generally mirror images of each other. The concave sides 94, 96 include small convex portions 93 (which may be is substantially flat) where they are connected to the sides 90, 92.

Figure 16A:
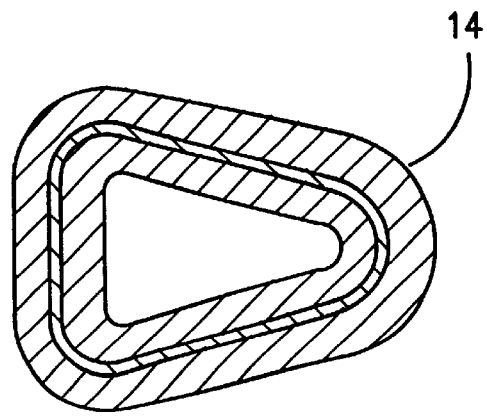
FIG. 16 is a view of a modified pear shape according to a second embodiment of the present invention.
Figure 16B:
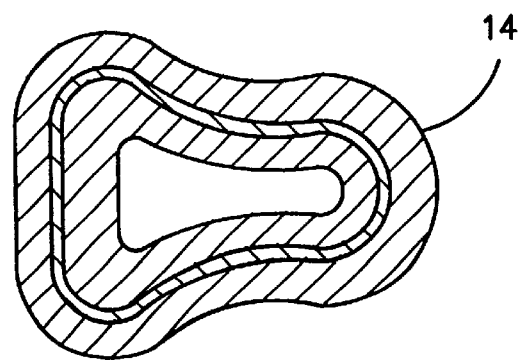
Figure 16C:
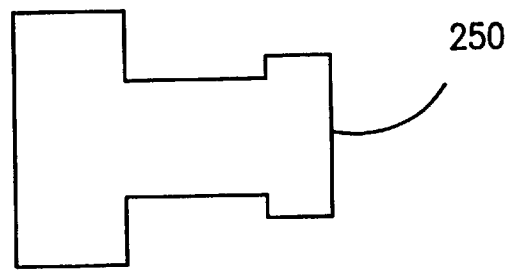

Many other variations in the pear shape of the capacitor 14 shown in FIG. 3 are contemplated. The pear shape according to the invention may also be in the general shape of a triangle with rounded corners and two equal sides as shown in FIG. 16a. Another example of a variation is shown in FIG. 16b. The top and bottom walls of the pear-shaped capacitor 14 of FIG. 16b are more indented as compared to the sides of the pear-shaped capacitor 14 of FIG. 3. The indented-side pear shape can be produced using a mask having capacitor openings 250 of the shape shown in FIG. 16c.

In practice, the exact shape of the capacitor is determined by the minimum bit line distance Db and minimum capacitor distance Dc as well as the size and positioning of the bit lines. The shape of the container capacitors is generally selected in order to use as much space as possible (thereby increasing capacitance) while maintaining these minimum distances.

The advantages of the capacitors in accordance with the present invention will now be discussed in further detail with reference to FIG. 3. As noted, FIG. 3 shows a top view of a portion of a DRAM memory circuit from which the upper layers have been removed to reveal container capacitors 14 with pear-shaped cross section according to the present invention arranged around a bit line contact 16. Six container capacitors 14 are shown in FIG. 3, each of which has been labeled with separate reference designations A to F. One side 90 of each of the container capacitors 14 has a flat portion 98, while the other side 92 generally has the shape of a convex semi-circle. The top and bottom 94, 96 of each of the container capacitors 14 contain corresponding portions that can be "fit" together such that space between the top of one container capacitor 14 and the bottom of a neighboring container capacitor 14 can be kept constant at the minimum capacitor distance Dc over a substantial portion of the top and bottom. The percentage of the cross sectional perimeter that can be kept at the minimum capacitor distance can vary from approximately 10% to approximately 70% of the total cross sectional perimeter.

Figure 2:
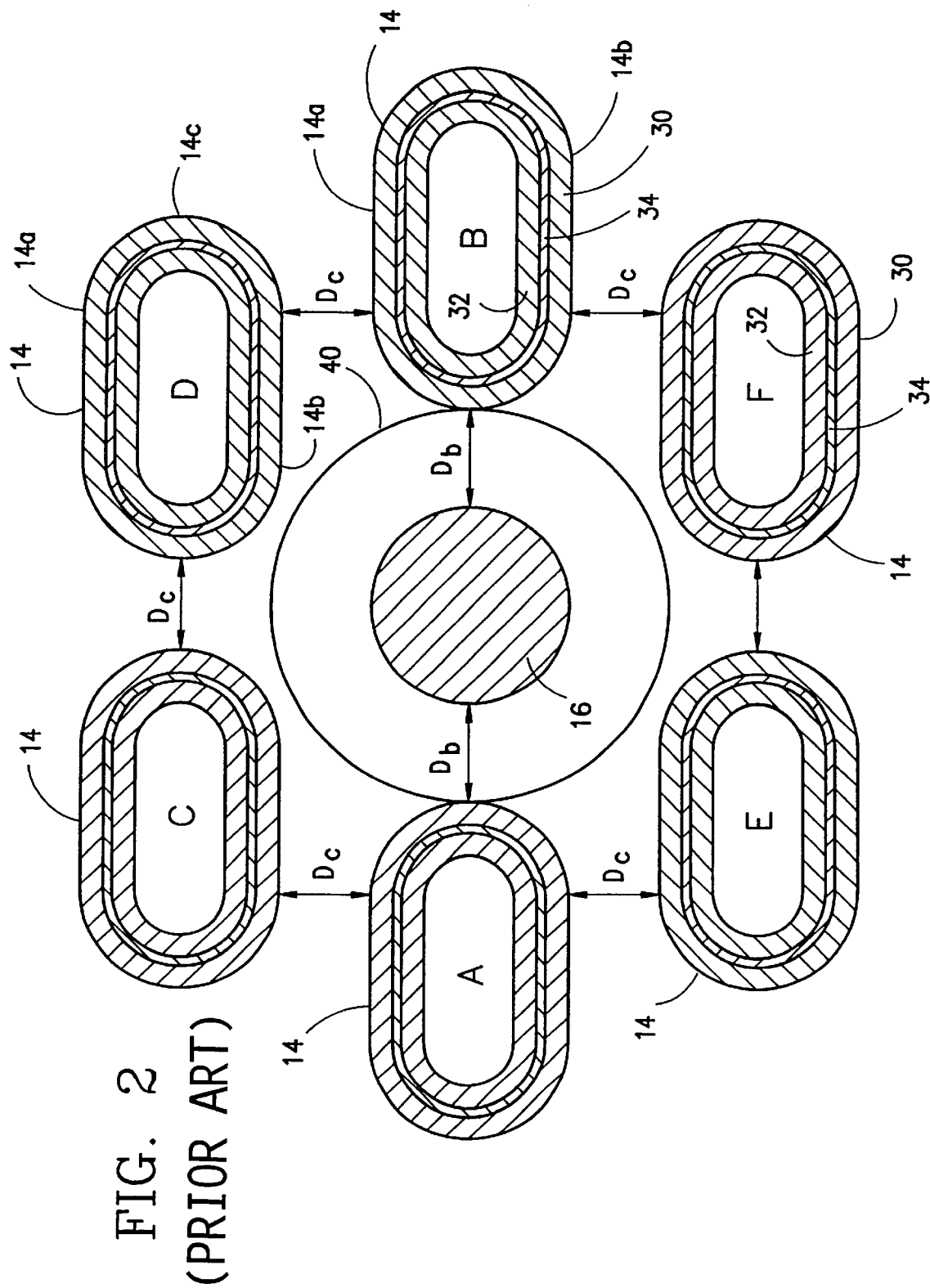
FIG. 2 is a top view of a cross section of a known memory circuit showing a number of conventionally shaped container capacitors surrounding a bit line contact.

A portion of the outer layer 30 on each of the six capacitors 14 lies at the minimum bit line distance Db from the bit line contact 16 at the places indicated in FIG. 3. This should be contrasted with the known oval shaped capacitors of FIG. 2, in which only two of the six capacitors were at the minimum bit line distance Db. Additionally, the outer layers 30 of adjacent container capacitors 14 are at the minimum capacitor distance Dc over substantial portions of their perimeters. Specifically, the flat portion 98 of side wall 90 of both the upper pair of capacitors C-D and the lower pair of capacitors E-F are separated by the minimum capacitor distance Dc all along the entire flat portion 98 of the sidewall 90 as indicated by the horizontal line segments Dc shown in FIG. 3. The top wall 94 of capacitor A is separated from the bottom wall 96 of capacitor C over the corresponding portions, i.e., segments, of their perimeters as indicated by the diagonal line segments Dc in FIG. 3. Similar separations are present between capacitor pairs A-E, B-D, and B-F.

Container capacitors having the pear-shaped cross section shown in FIG. 3 can have cross sectional perimeters about 10% larger than oval shaped container capacitors. The capacitor plate area of a container capacitor is the product of the height of the container and the perimeter of the cross sectional shape of the container. The total capacitance of any capacitor is directly proportional to the plate area. Therefore, container capacitors with pear-shaped cross sections typically result in about a 10% increase in total capacitance while maintaining the same minimum bit line and container distances as compared to container capacitors with oval-shaped cross sections.

Figure 17:
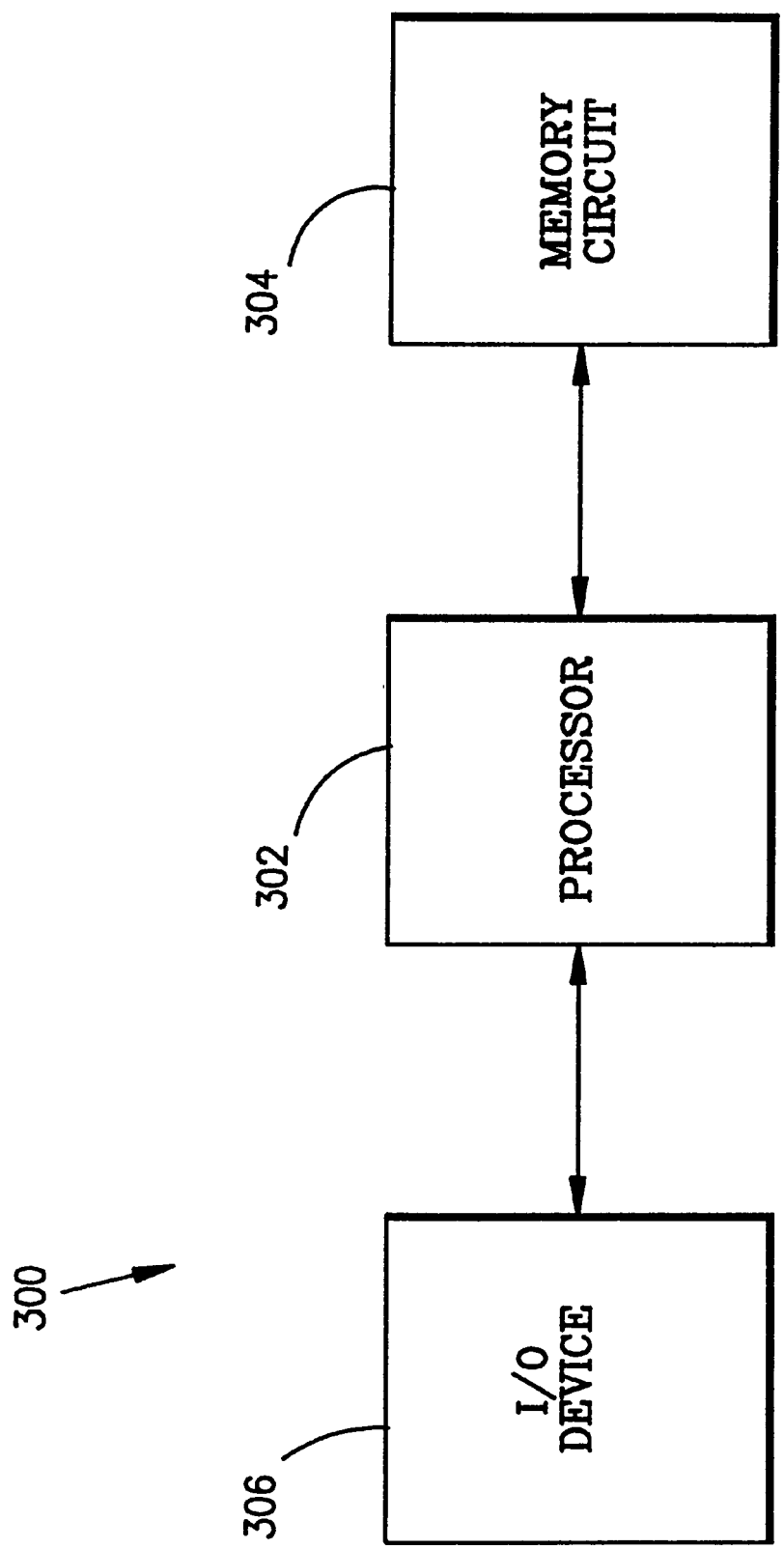
FIG. 17 is a block diagram of a computer system comprising a memory including a pear-shaped capacitor.

FIG. 17 illustrates a computer system 300 according to one embodiment of the present invention. The computer system 300 comprises a CPU (central processing unit) 302, a memory circuit 304, and an I/O (input/output) device 306. The memory circuit 304 contains a DRAM memory circuit including pear-shaped capacitors according to the present invention, Memory other than DRAM may be used. Also, the CPU itself may be an integrated processor which utilizes integrated pear-shaped capacitors.

It should again be noted that although the invention has been described with specific reference to DRAM memory circuits and container capacitors, the invention has broader applicability and may be used in any integrated circuit requiring capacitors. Similarly, the process described above is but one method of many that could be used. Accordingly, the above description and accompanying drawings are only illustrative of preferred embodiments which can achieve and provide the objects, features and advantages of the present invention. It is not intended that the invention be limited to the embodiments shown and described in detail herein. The invention is only limited by the spirit and scope of the following claims.

What is claimed as new and desired to be protected by Letters Patent of the United States is:

1. An integrated memory circuit comprising:
   a plurality of memory cells connected in a memory array, at least some of the plurality of memory cells each comprising
      a capacitor;
      a transistor connected to the capacitor; and
      a plurality of bit line contacts, each of the memory cells being connected to a respective bit line contact;
   wherein the capacitor is comprised of a pair of conductive surfaces and a dielectric provided between said surfaces, the capacitors have surface cross sectional shapes and are arranged around a bit line such that a portion of at least one surface of each of the capacitors is separated from at least one surface of a neighboring capacitor by a minimum capacitor distance at more than one point along their respective surface portions.

2. The integrated memory circuit of claim 1, wherein the surfaces of the capacitors include one side portion having a flat portion, the capacitors being arranged such that the flat portion of at least one surface of one capacitor is separated from the flat portion of at least one surface of a neighboring capacitor by a minimum capacitor distance along the entire flat portions.

3. The integrated circuit of claim 1, wherein the capacitor surfaces include top and bottom surface portions, the capacitors being arranged such that the top and bottom surface portions of at least one surface of neighboring capacitors are separated by the minimum capacitor distance.

4. An integrated circuit comprising:
   a plurality of capacitors arrayed around a bit line;
   wherein the capacitors have surfaces with cross sectional shapes and the capacitors are arranged such that a substantial portion of at least one of the surfaces of each of the capacitors is separated from neighboring capacitors by a minimum capacitor distance.

5. The integrated circuit of claim 4, wherein the substantial portion is a value of from approximately 10% to approximately 70% of the surface.

* * * * *